(12) United States Patent
Mineta

(10) Patent No.: US 10,998,246 B2
(45) Date of Patent: May 4, 2021

(54) METHOD OF MANUFACTURING A SEMICONDUCTOR DEVICE

(71) Applicant: RENESAS ELECTRONICS CORPORATION, Tokyo (JP)

(72) Inventor: Noriaki Mineta, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/384,476

(22) Filed: Apr. 15, 2019

(65) Prior Publication Data
US 2019/0348335 A1    Nov. 14, 2019

(30) Foreign Application Priority Data

May 9, 2018  (JP) .............................. JP2018-090608

(51) Int. Cl.
| | | |
|---|---|---|
| *H01L 23/08* | (2006.01) | |
| *G01R 31/28* | (2006.01) | |
| *H01L 23/29* | (2006.01) | |
| *H01L 23/495* | (2006.01) | |
| *H01L 23/532* | (2006.01) | |

(52) U.S. Cl.
CPC .......... *H01L 23/08* (2013.01); *G01R 31/2853* (2013.01); *H01L 23/293* (2013.01); *H01L 23/49503* (2013.01); *H01L 23/49541* (2013.01); *H01L 23/49575* (2013.01); *H01L 23/53209* (2013.01)

(58) Field of Classification Search
CPC ...................................................... H01L 23/08
See application file for complete search history.

(56) References Cited

U.S. PATENT DOCUMENTS

| | | | |
|---|---|---|---|
| 10,032,700 B2 | 7/2018 | Takahashi | |
| 2009/0180505 A1* | 7/2009 | Kohda | B82Y 20/00 372/43.01 |
| 2013/0115722 A1* | 5/2013 | Nakagawa | H01L 24/97 438/15 |
| 2014/0017822 A1* | 1/2014 | Sakai | H01L 21/6836 438/15 |

FOREIGN PATENT DOCUMENTS

| | | |
|---|---|---|
| JP | 07-14867 A | 1/1995 |
| JP | 2015-176907 A | 10/2015 |

* cited by examiner

*Primary Examiner* — Mohammad M Choudhry
(74) *Attorney, Agent, or Firm* — McDermott Will & Emery LLP

(57) ABSTRACT

Reliability of a semiconductor device is improved. A method of manufacturing a semiconductor device includes a step of preparing a lead frame in which a plurality of device forming regions are arranged in a matrix, a die bonding step of mounting a semiconductor chip on each device region, a resin sealing step of individually covering each semiconductor chip with a sealing body, and a lead plating step of plating an outer portion of a lead exposed from the sealing body. Between the resin sealing step and the lead plating step, an inspection step for detecting defective products in the resin sealing step and a defective product removal step for removing a device region of defective products are provided.

8 Claims, 23 Drawing Sheets

FIG. 7
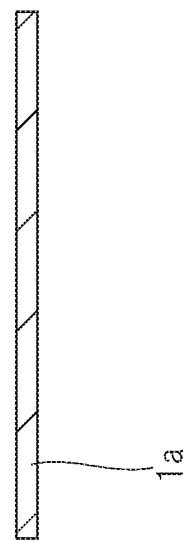
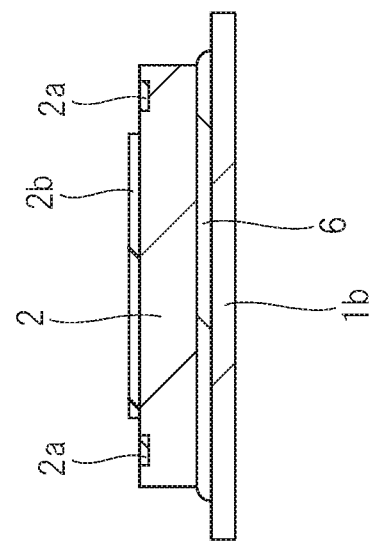
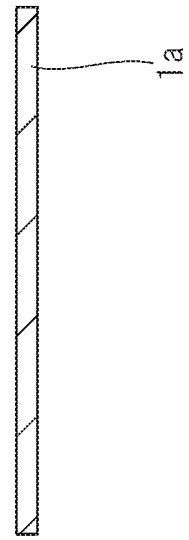

METHOD OF MANUFACTURING A SEMICONDUCTOR DEVICE

CROSS-REFERENCE TO RELATED APPLICATIONS

The disclosure of Japanese Patent Application No. 2018-090608 filed on May 9, 2018 including the specification, drawings and abstract is incorporated herein by reference in its entirety.

BACKGROUND OF THE INVENTION

The present invention relates to a technique effective for application to, for example, a method of manufacturing a resin-sealed semiconductor device.

In Japanese Patent Laying-Open No. 2015-176907, there is discloses a method of manufacturing a semiconductor device using a lead frame in which device regions are arranged in a matrix.

The method of manufacturing a semiconductor device includes steps of lead frame preparation, die bonding, wire bonding, molding, lead cutting (dam bar cutting), marking, plating, lead cutting (gate cutting), lead forming, and lead cutting (corner cutting).

In Japanese Patent Laying-Open No. 7-14867, there is discloses an automatic resin sealing apparatus for a semiconductor device having a recognition apparatus for detecting an unfilled semiconductor device generated in a resin sealing step, a mold for separating an unfilled semiconductor device from a lead frame, a storage box for storing the separated unfilled semiconductor device, and a counter for counting the number of stored unfilled semiconductor devices separated.

SUMMARY OF THE INVENTION

In recent years, in a molding step of a semiconductor device using a lead frame in which device regions are arranged in a matrix, the number of lead frames in which an unfilled defect of a sealing resin occurs tends to increase.

The factors are, for example, thinning of the semiconductor device, increase in the number of device regions per lead frame, and so on.

According to the study by the inventors of the present application, it has been confirmed that a plating defect occurs when a lead frame including a semiconductor device in which an unfilled defect occurs in a molding step (resin sealing step) is advanced to a plating step.

In an unfilled and defective semiconductor device, for example, a semiconductor chip may be exposed from a sealing body.

That is, an organic protective film such as a polyimide film formed on the surface of the semiconductor chip or an adhesive layer such as a silver paste for adhering the semiconductor chip to the die pad is exposed from the sealing body.

Therefore, when a lead frame including an unfilled defective semiconductor device is immersed in a plating solution, a contaminant is mixed into the plating solution from the organic protective film, the adhesive layer, or the like, and the plating solution is contaminated.

When the plating step is performed with the contaminated plating solution, plating defects occur in the lead frame not including the unfilled defective semiconductor device, and the reliability of the semiconductor device is reduced.

That is, in a resin-sealed semiconductor device, improvement in reliability is required.

Other objects and novel features will become apparent from the description of this specification and the accompanying drawings.

According to one embodiment, a method of manufacturing a semiconductor device includes a step of preparing a lead frame in which a plurality of device forming regions are arranged in a matrix, a die bonding step of mounting a semiconductor chip on each device region, a resin sealing step of individually covering each semiconductor chip with a sealing body, and a lead plating step of plating an outer portion of a lead exposed from the sealing body.

Between the resin sealing step and the lead plating step, an inspection step for detecting defective products in the resin sealing step and a defective product removal step for removing a device region of defective products are provided. According to one embodiment, reliability of the semiconductor device can be improved.

BRIEF DESCRIPTION OF THE DRAWINGS

FIG. 7 is a cross-sectional view along line A-A of FIG. 6.

DESCRIPTIONS OF THE PREFERRED EMBODIMENTS

Figure 1:
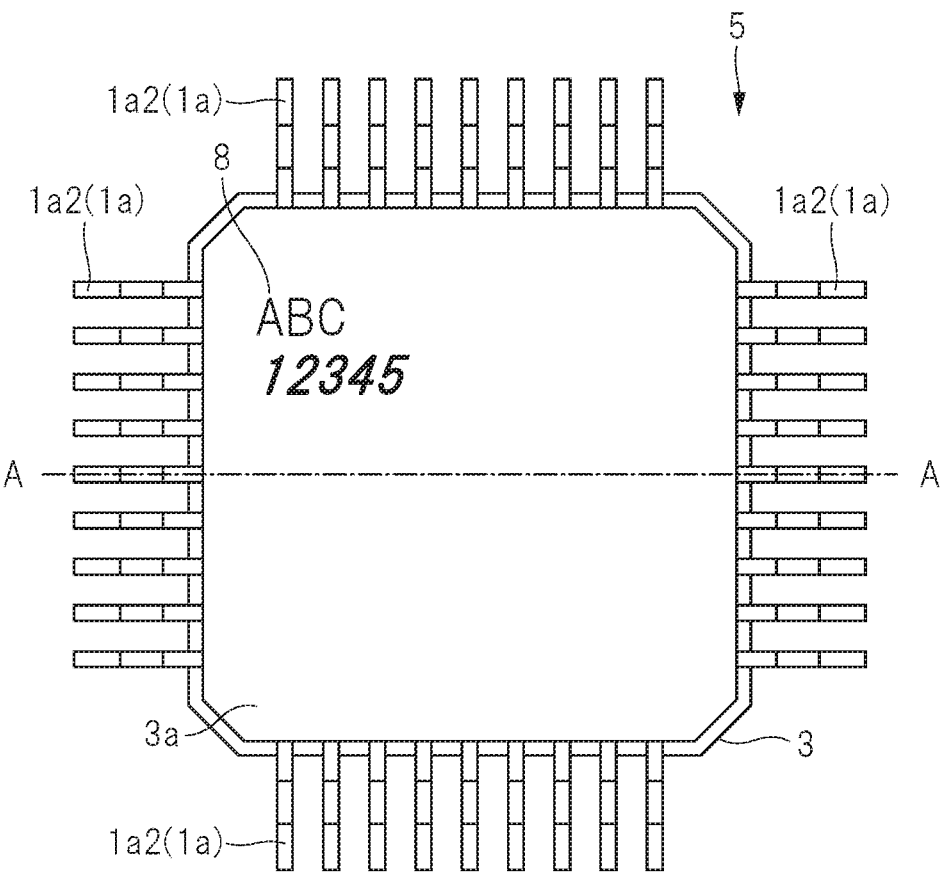
FIG. 1 is a plan view showing an example of a semiconductor device according to an embodiment.

In the following embodiments, when it is necessary for convenience, the description will be made by dividing into a plurality of sections or embodiments, but except for the case specifically specified, these sections and embodiments are not independent of each other, and one of them is related to some or all of modifications, details, supplementary description, and the like of the other.

In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like.

The same applies to the above numerical values and ranges.

In all the drawings for explaining the embodiments, the same members are denoted by the same reference numerals in principle, and repetitive descriptions thereof are omitted.

In order to make the drawings easy to understand, hatching may be used even in plan view.

Figure 2:
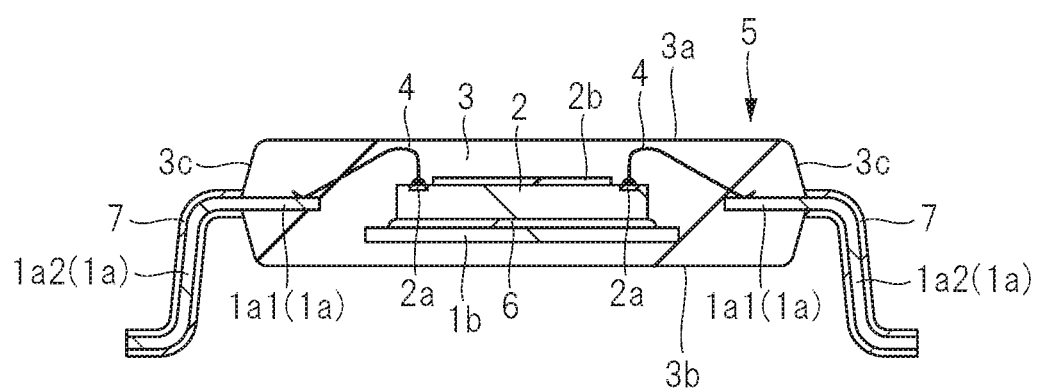
FIG. 2 is a cross-sectional view of the semiconductor device of the embodiment.

FIG. 1 is a plan view showing an example of a semiconductor device of the embodiment, and FIG. 2 is a cross-sectional view of the semiconductor device of the embodiment.

Here, the semiconductor device 5 is exemplified by a QFP (Quad Flat Package).

As shown in FIG. 1, the semiconductor device 5 has a substantially rectangular sealing body 3 and a plurality of leads 1a.

A plurality of leads 1a, which are external connection terminals, are arranged on each of the four sides constituting a substantially rectangular shape.

The plurality of leads 1a protrude from the sealing body 3 and extend in a direction orthogonal to each side.

In the plurality of leads 1a, a portion exposed from the sealing body 3 is an outer portion 1a2.

In plan view, the corner of the sealing body 3 is chamfered, but it is not always necessary to chamfer the corner.

That is, the sealing body 3 may have a rectangular shape.

A mark 8 is attached to the main surface 3a of the sealing body 3.

The mark indicates a product number, a lot number, and the like of the semiconductor device 5.

The mark 8 may be attached to the back surface of the sealing body 3 instead of the main surface 3a.

As shown in FIG. 2, the die pad 1b, the adhesive layer 6, the semiconductor chip 2, the wire 4, and the inner portion 1a1 of the lead 1a exist inside the sealing body 3.

Outside the sealing body 3, the outer portion 1a2 of the lead 1a exists.

The semiconductor chip 2 has a plurality of pad electrodes 2a as external connection terminals of the semiconductor chip 2.

Although not shown, a large number of semiconductor elements are formed in the semiconductor chip 2, and a large number of logic circuits are formed by these semiconductor elements.

The pad electrode 2a and the semiconductor element are formed on the main surface side of the semiconductor chip 2, and the main surface of the semiconductor chip 2 is covered with an organic protective film 2b made of a polyimide film or the like.

The back surface of the semiconductor chip 2 is bonded to the die pad 1b with an adhesive layer 6.

As the adhesive layer 6, for example, silver paste is used.

The silver paste contains silver and an epoxy resin.

The lead 1a has an inner portion 1a1 that is an inner portion of the sealing body 3 and an outer portion 1a2 that is a portion exposed from the sealing body 3.

The outer portion 1a2 has a gull wing shape including a first folded portion and a second folded portion.

The outer portion 1a2 protruding from the side surface 3c of the sealing body 3 is bent toward the back surface 3b side of the sealing body 3 at the first bending portion, and is bent in a direction away from the sealing body 3 at the second bending portion.

The pad electrode 2a of the semiconductor chip 2 is connected to the inner portion 1a1 of the lead 1a by a wire 4.

The wire 4 is made of, for example, gold (Au) or copper (Cu).

The outer portion 1a2 of the lead 1a is covered with the plating layer 7, but the inner portion 1a1 is not covered with the plating layer 7.

The plating layer 7 is made of, for example, lead-free solder.

The lead-free solder means a solder having a lead content of 0.1 wt % or less, and includes, for example, a solder material of SnBi type, SnAgCu type, SnCu type, or the like.

In FIG. 2, the thickness of the lead 1a and the die pad 1b is approximately 0.125 mm, the thickness of the semiconductor chip 2 is approximately 0.4 mm, and the thickness of the sealing body 3 is approximately 1.4 mm.

The sealing body 3 is made of, for example, a thermosetting epoxy resin.

Here, the example in which the die pad 1b is positioned in the sealing body 3 has been described, but the surface on the side opposite to the side on which the semiconductor chip 2 is mounted may be exposed from the sealing body 3.

Figure 3:
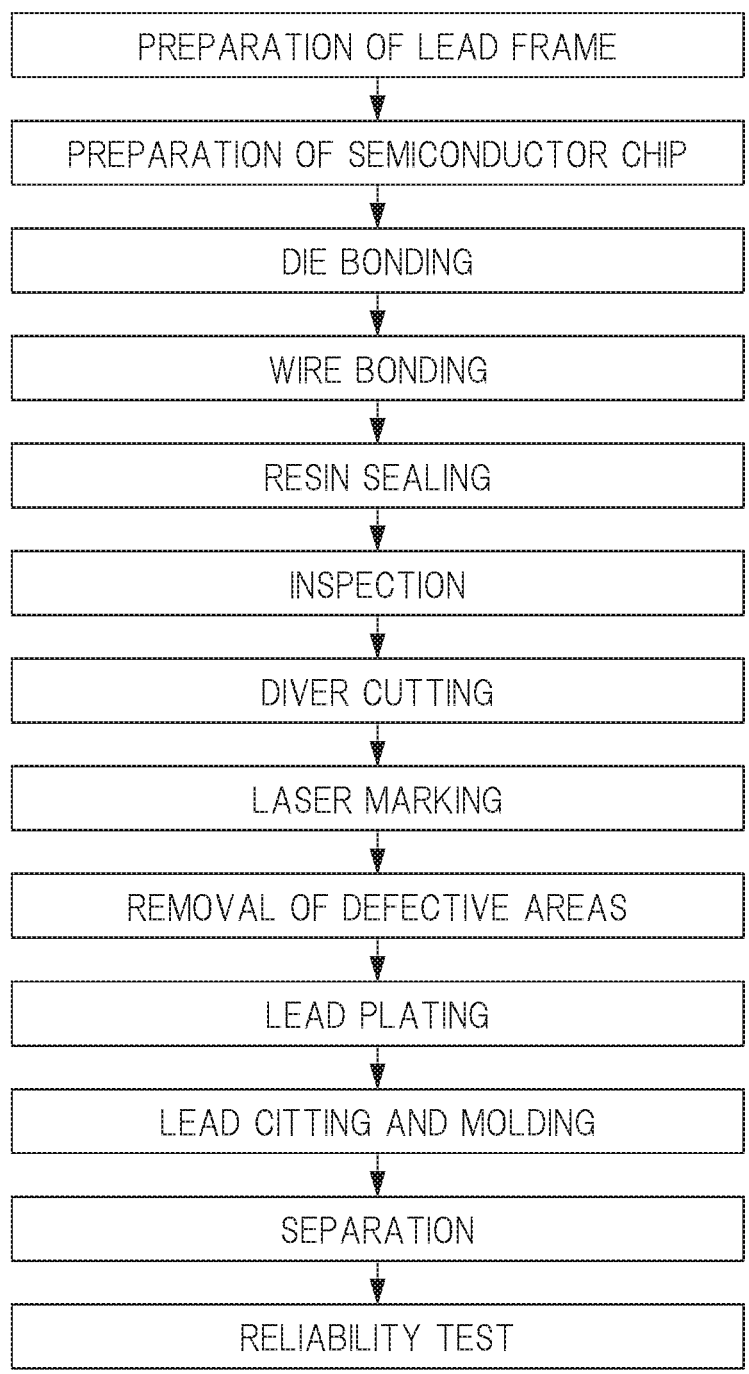
FIG. 3 is a step flow diagram showing the method of manufacturing the semiconductor device according to the embodiment.
Figure 4:
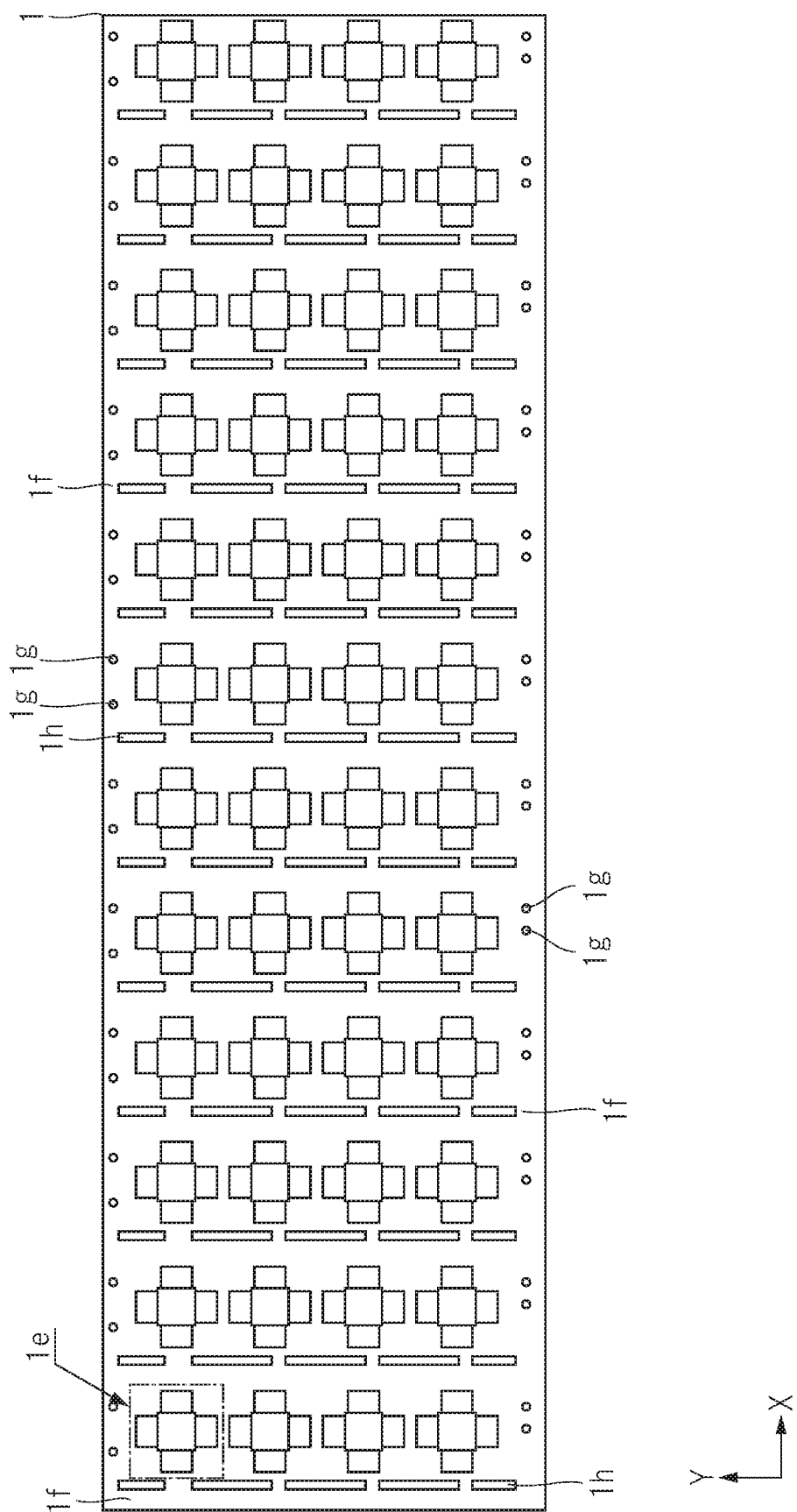
FIG. 4 is a plan view of a lead frame used in the manufacturing method of the semiconductor device of the embodiment.
Figure 5:
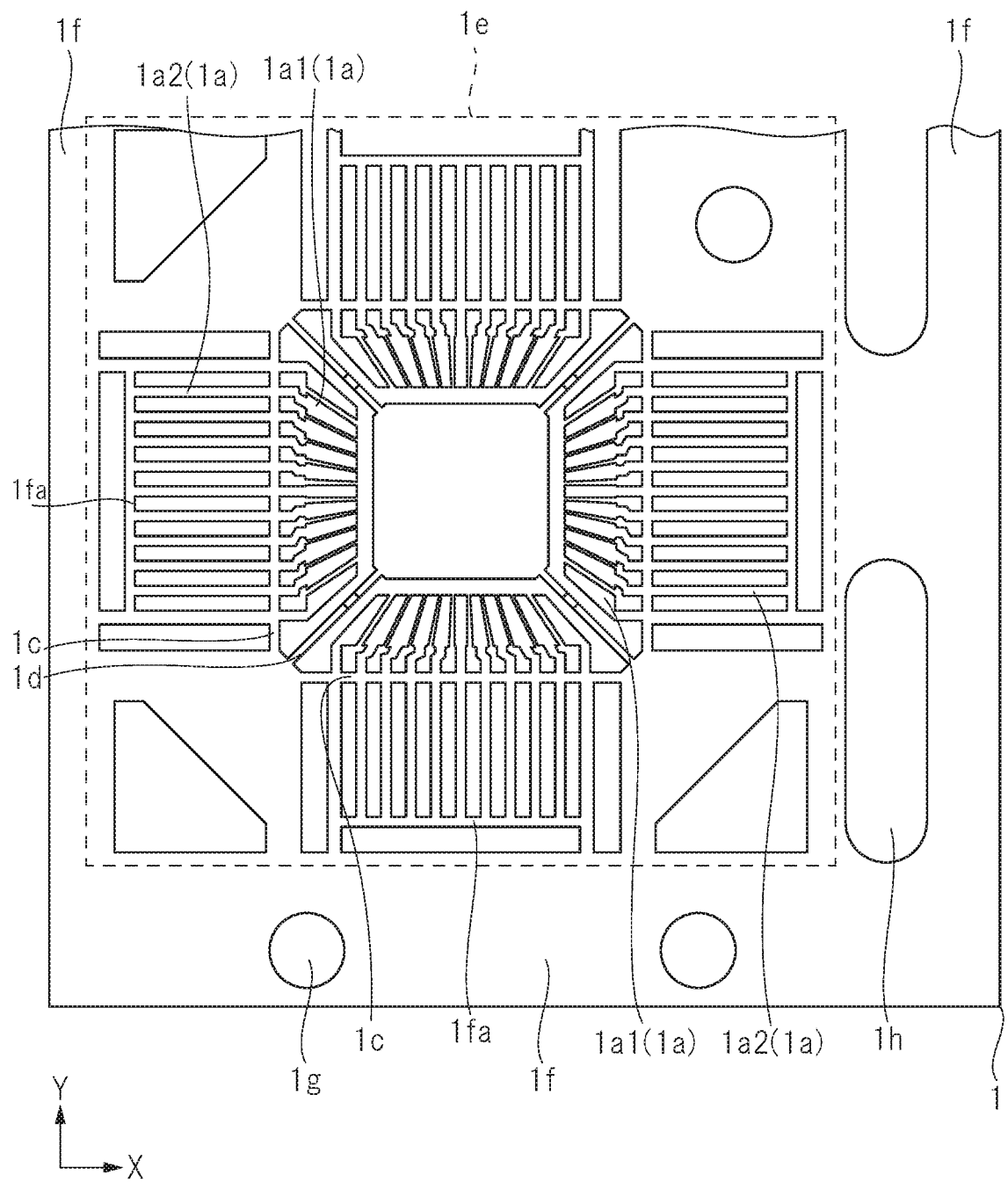
FIG. 5 is an enlarged plan view of the device region shown in FIG. 4.
Figure 6:
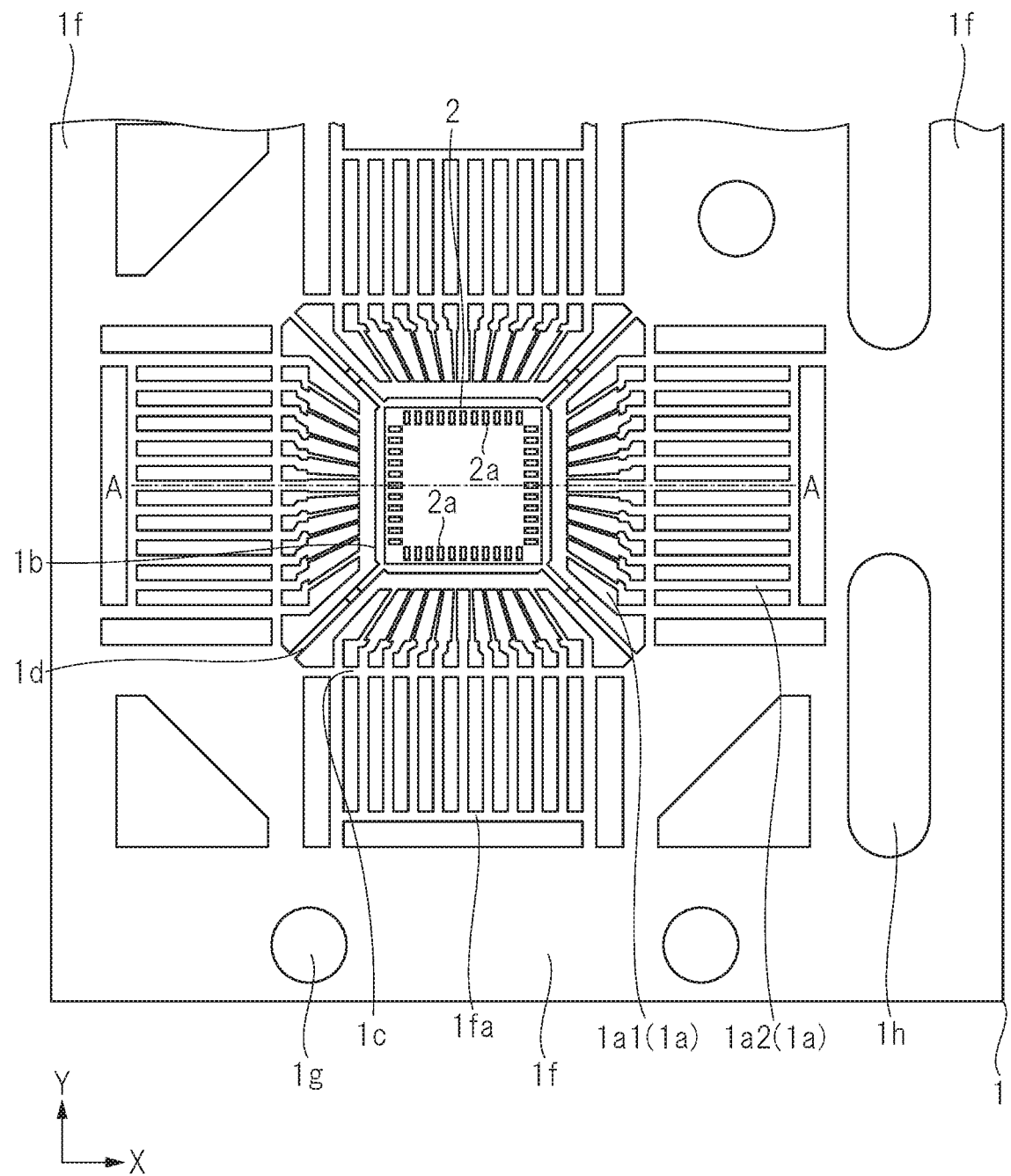
FIG. 6 is an enlarged plan view of the device region in the die bonding step.
Figure 8:
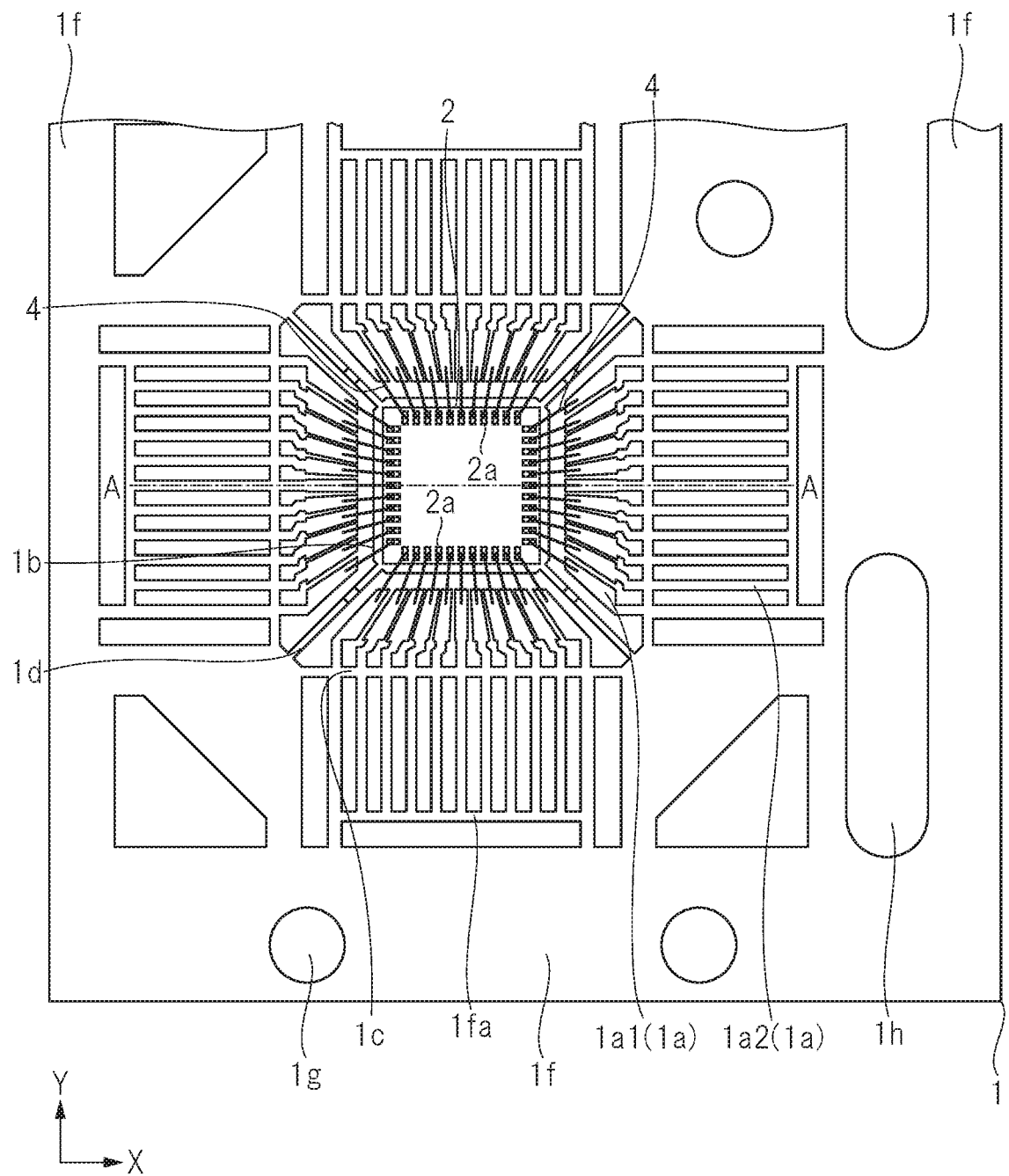
FIG. 8 is an enlarged plan view of the device region in the wire bonding step.
Figure 9:
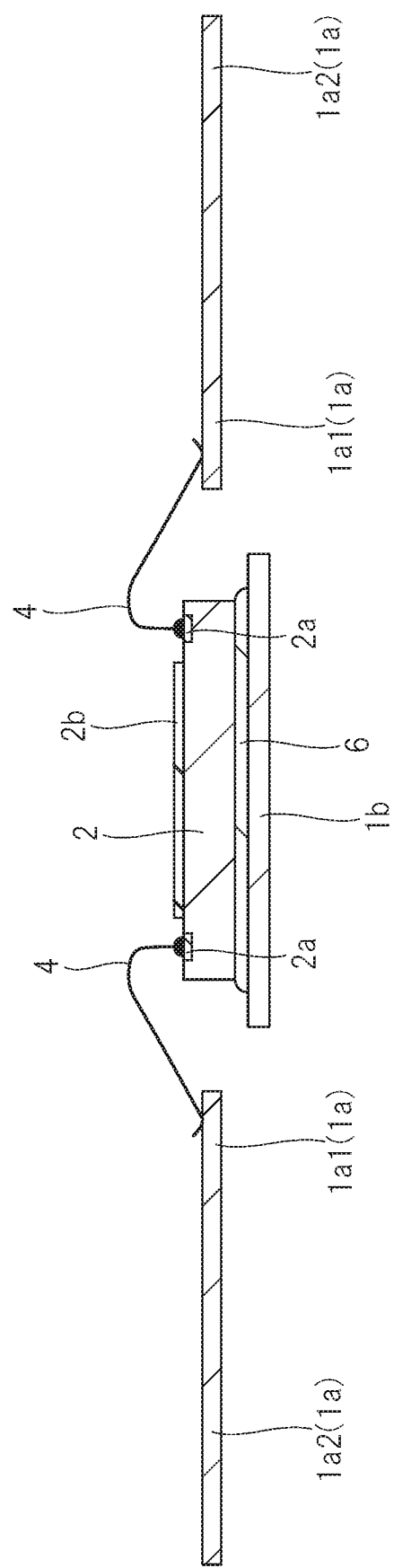
FIG. 9 is a cross-sectional view along line A-A of FIG. 8.
Figure 10:
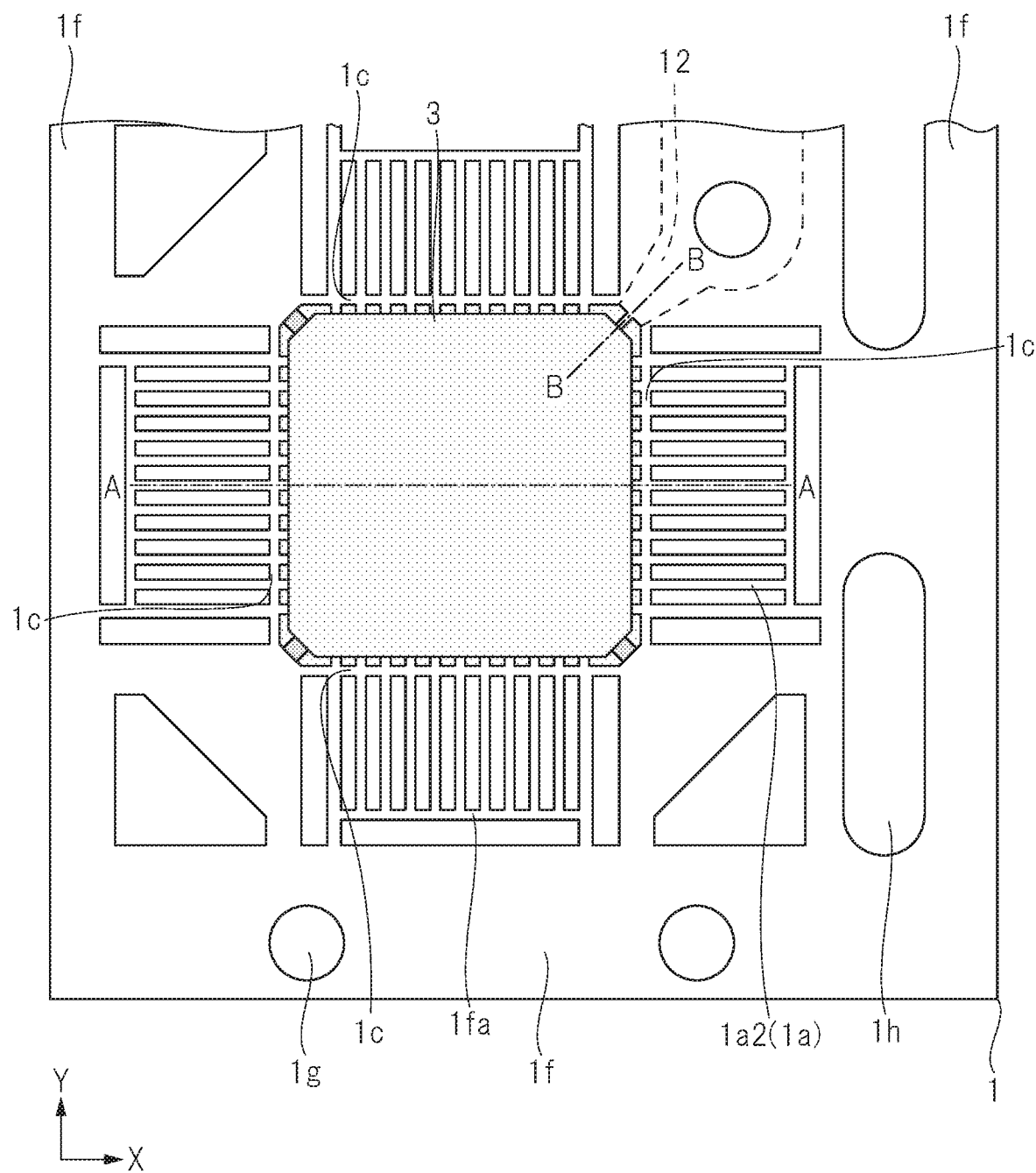
FIG. 10 is an enlarged plan view of the device region in the resin sealing step.
Figure 11:
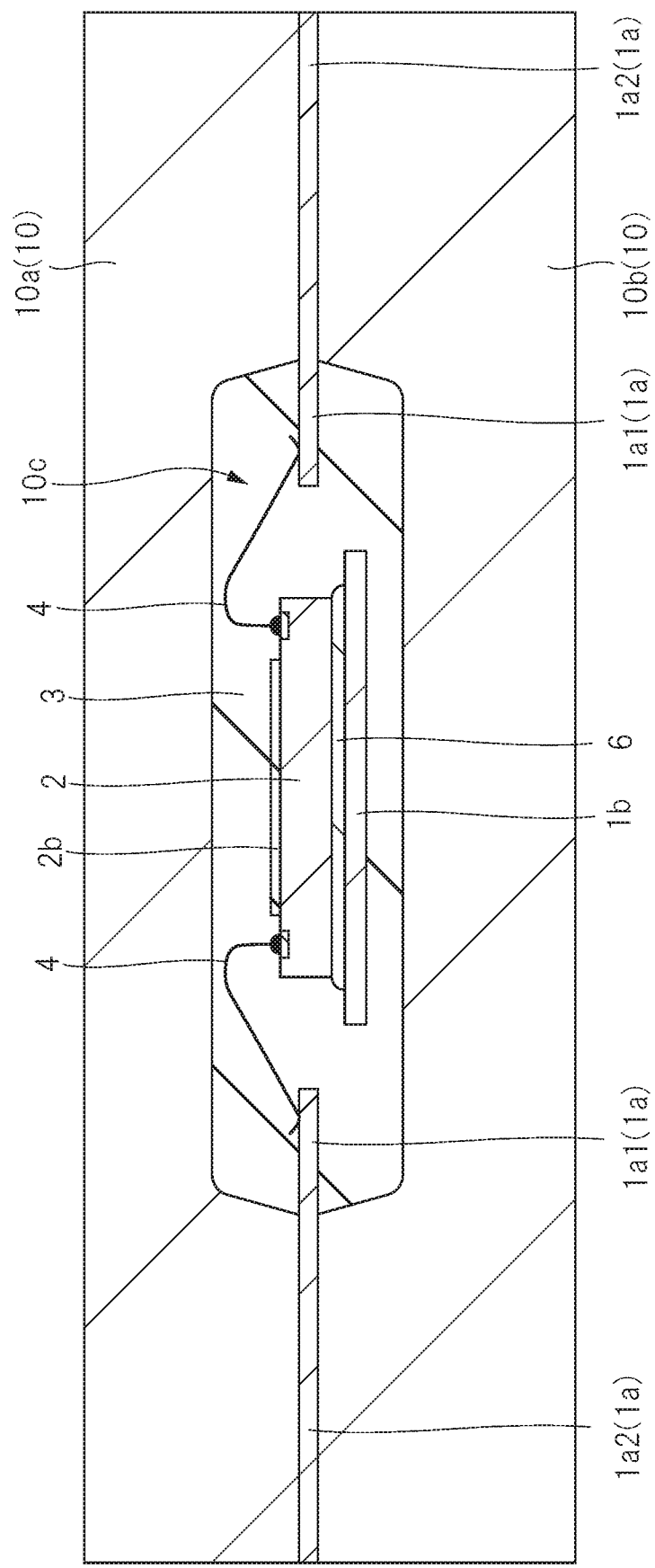
FIG. 11 is a cross-sectional view along line A-A of FIG. 10.
Figure 12:
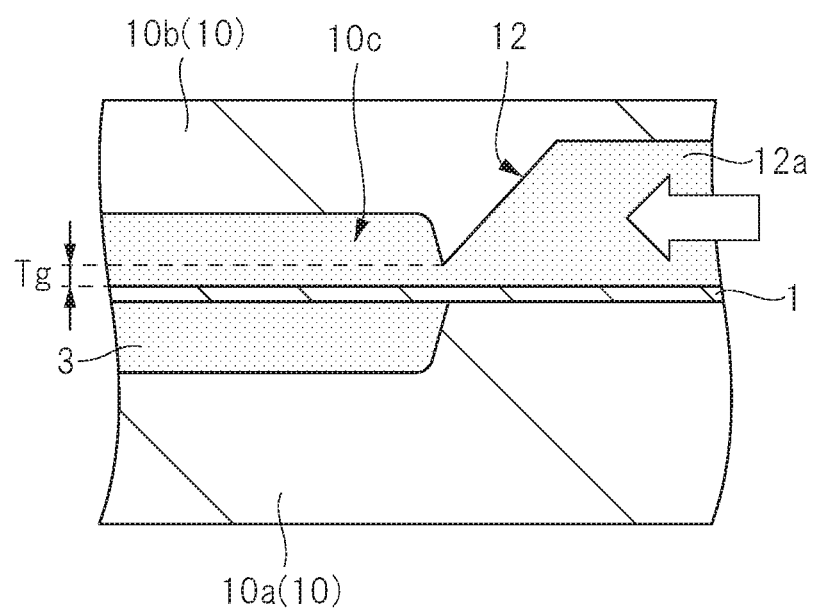
FIG. 12 is a cross-sectional view along line B-B of FIG. 10.
Figure 13:
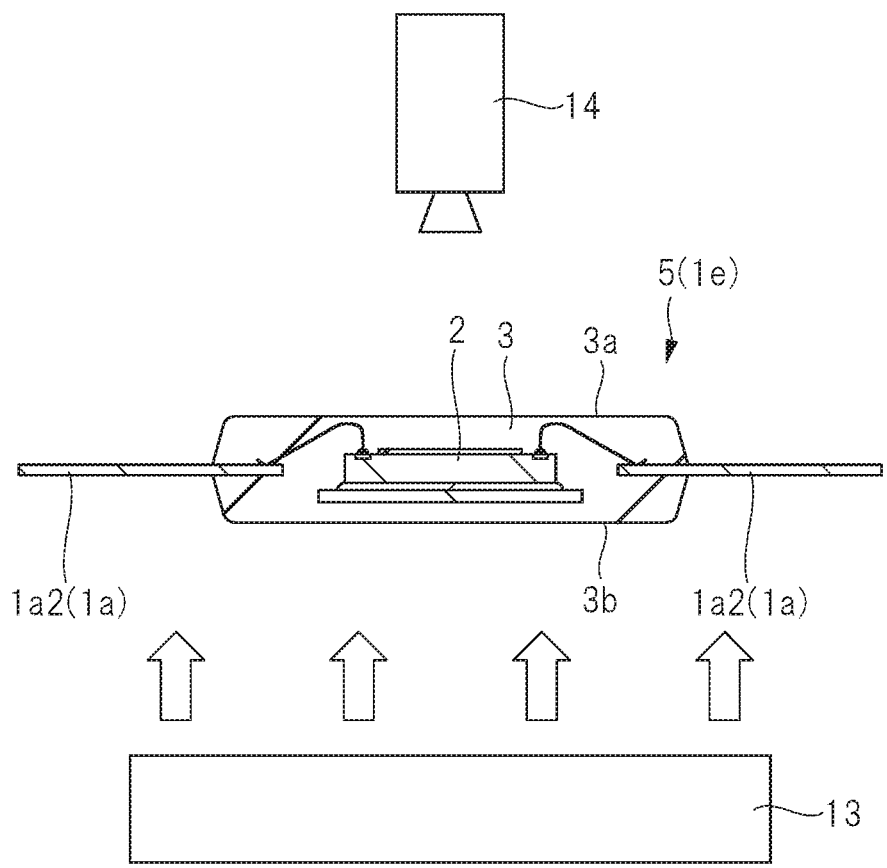
FIG. 13 is a cross-sectional view of the device region in the inspection step.
Figure 14:
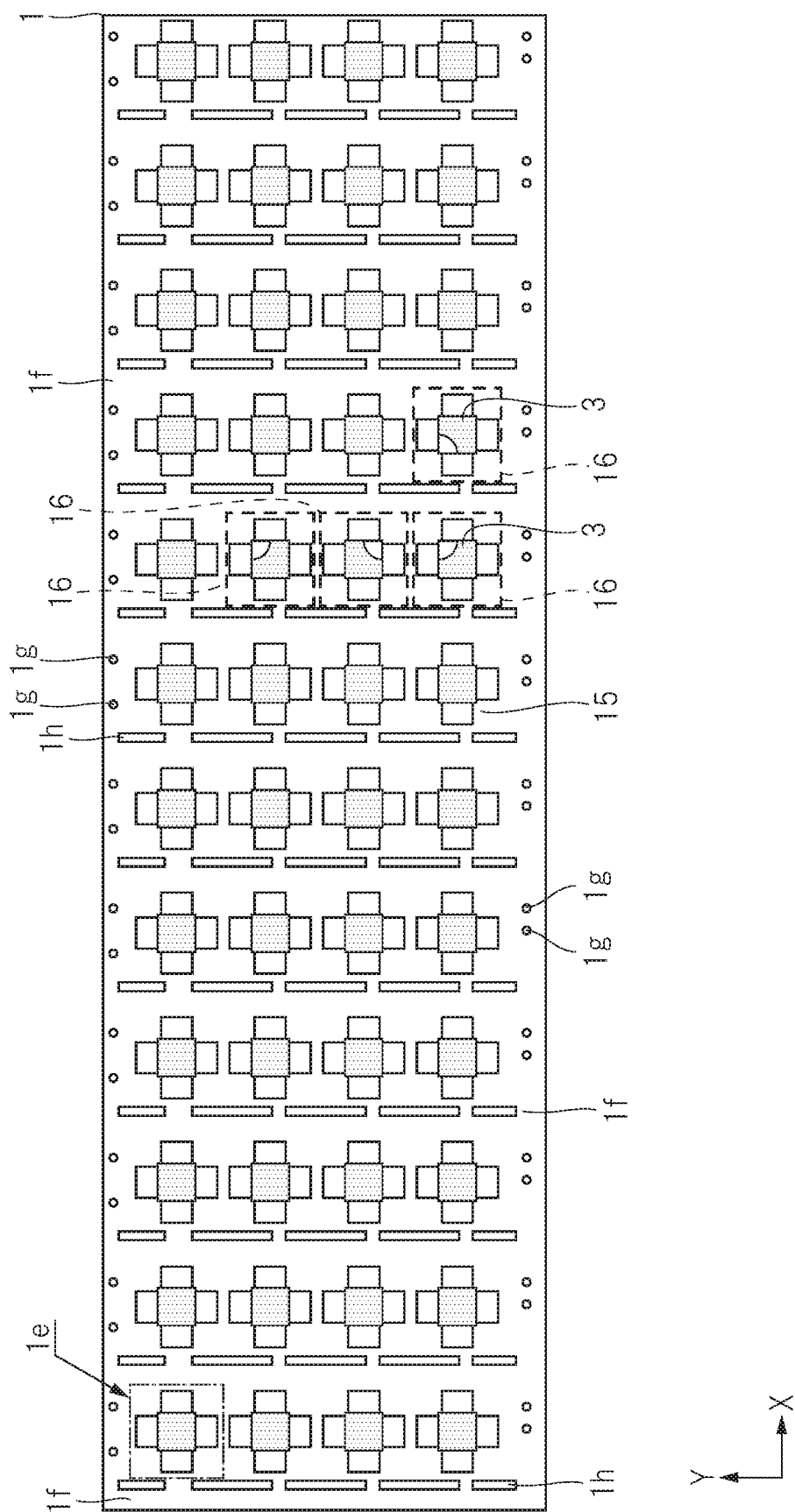
FIG. 14 is a plan view of the lead frame in the inspection step.
Figure 15:
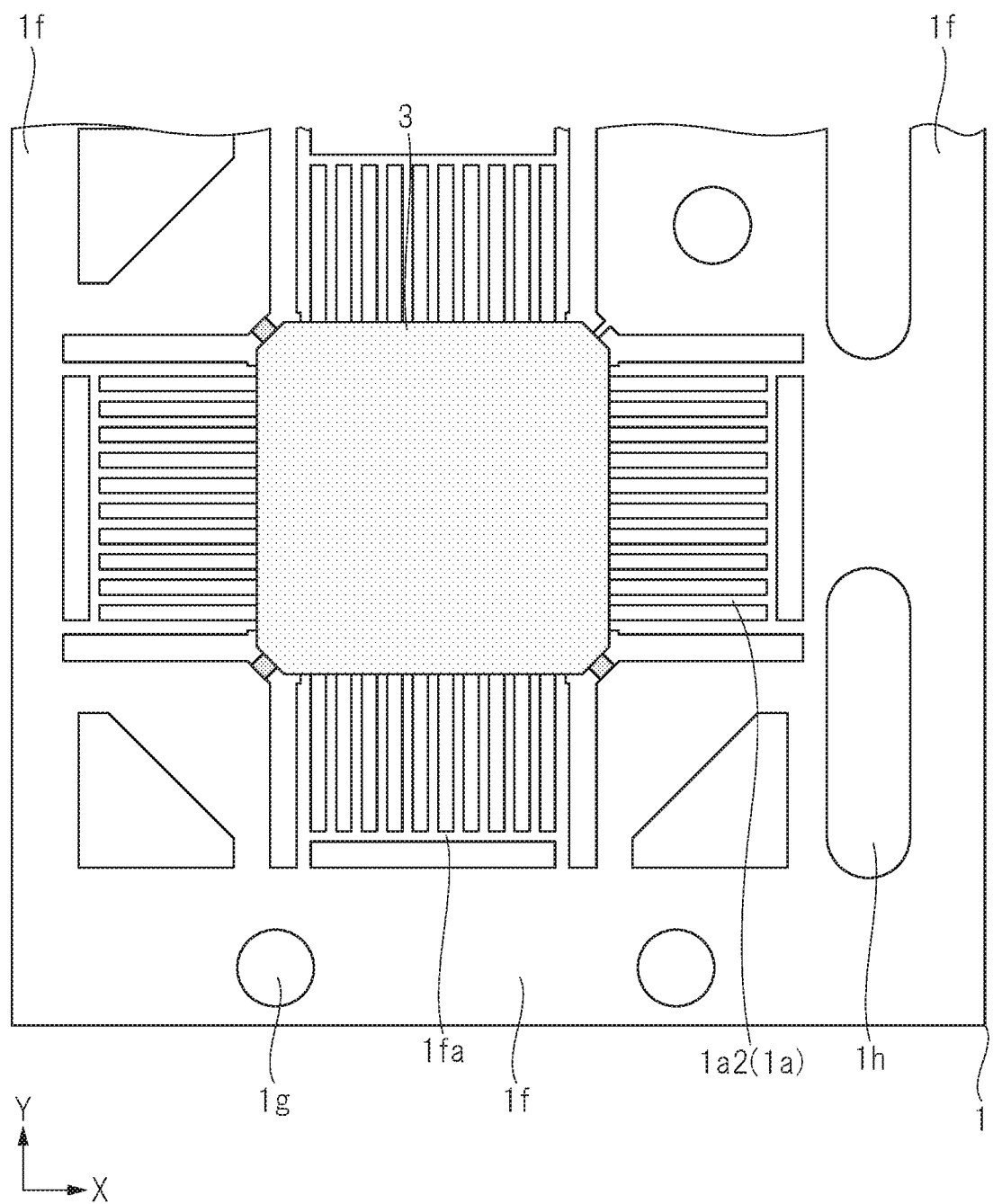
FIG. 15 is an enlarged plan view of the device region in the tie bar cutting step.
Figure 18:
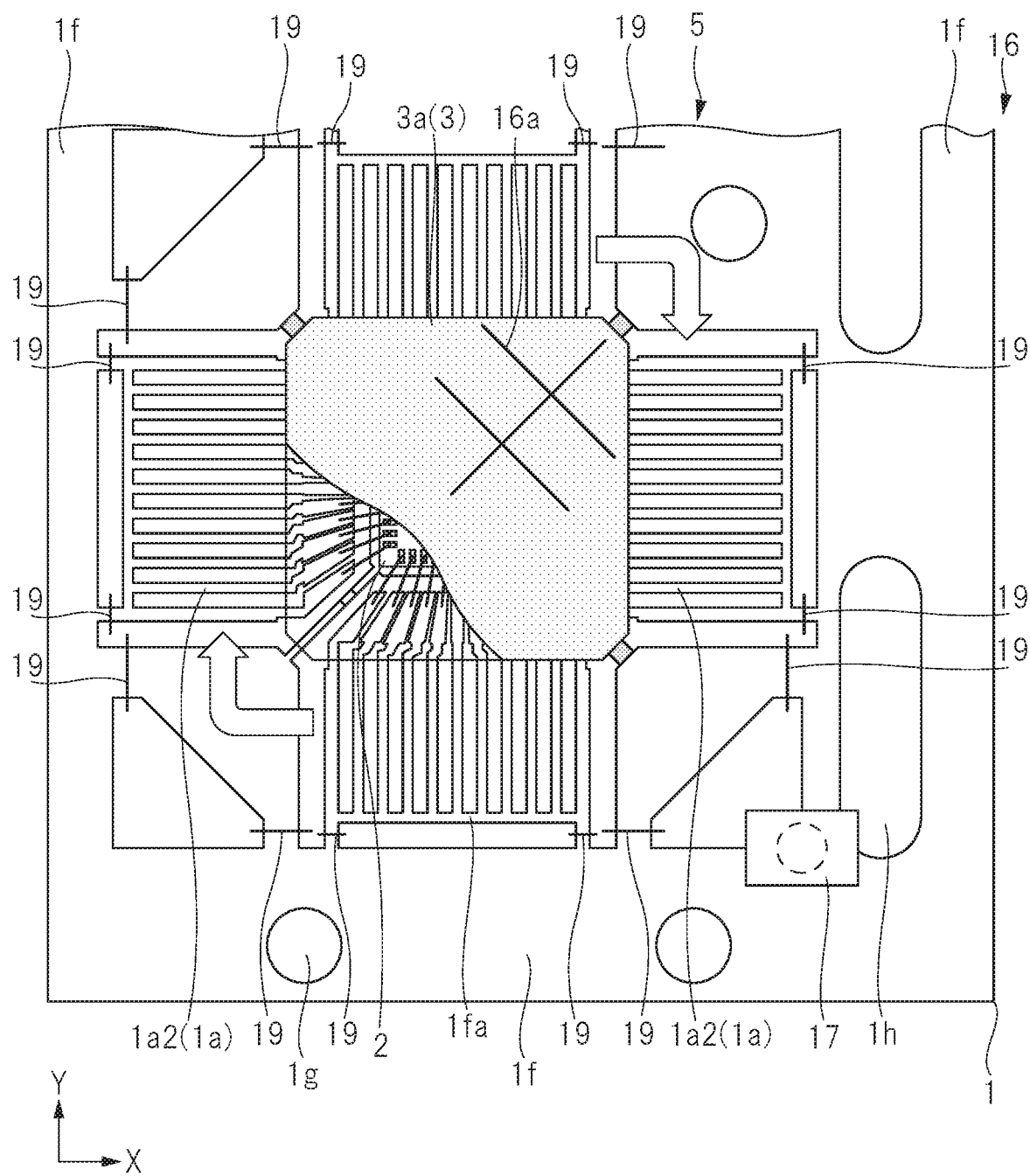
FIG. 18 is an enlarged plan view of the device region in the defective product removing step.
Figure 19:
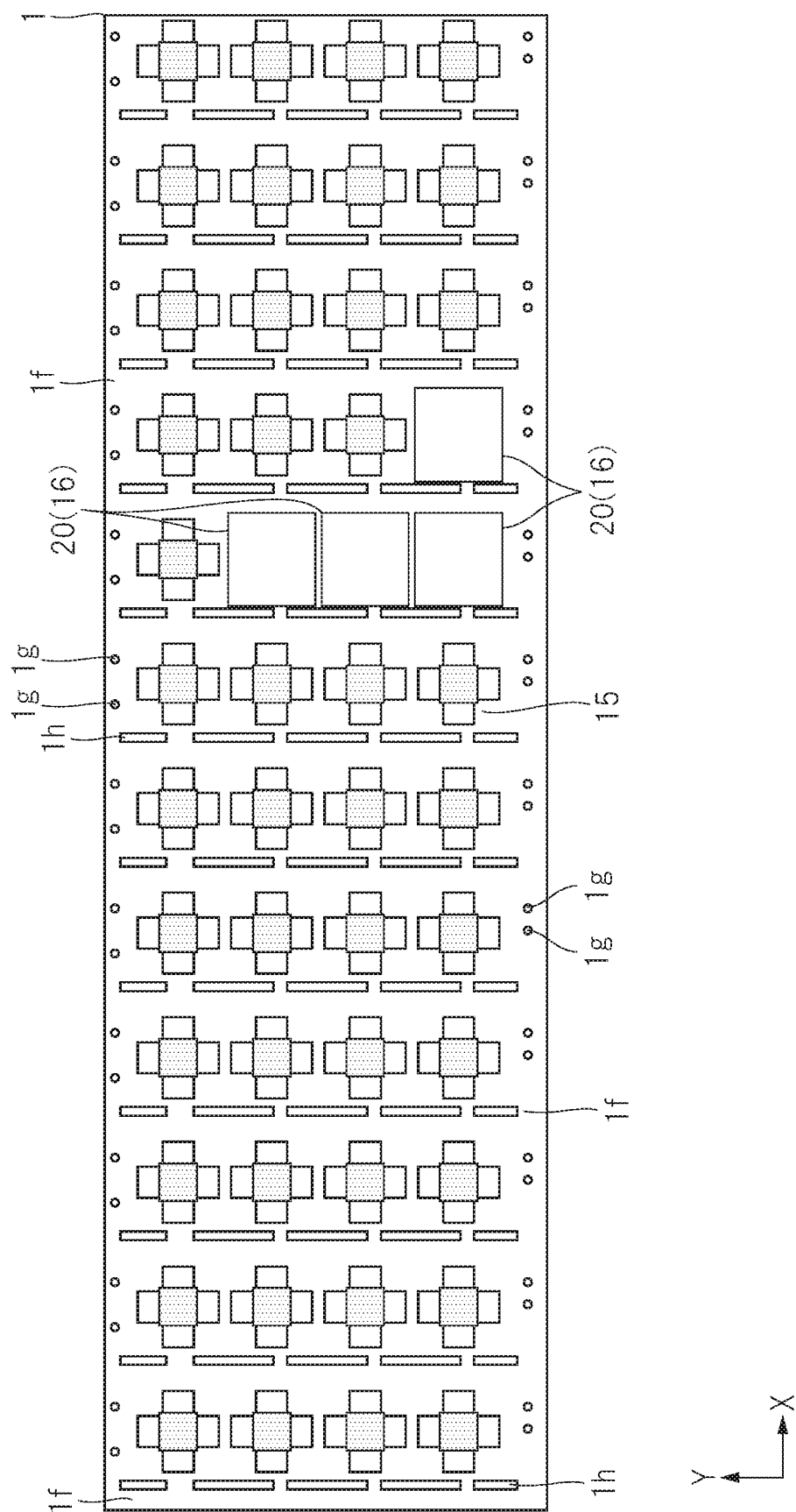
FIG. 19 is a plan view of the lead frame in the defective product removing step.
Figure 20:
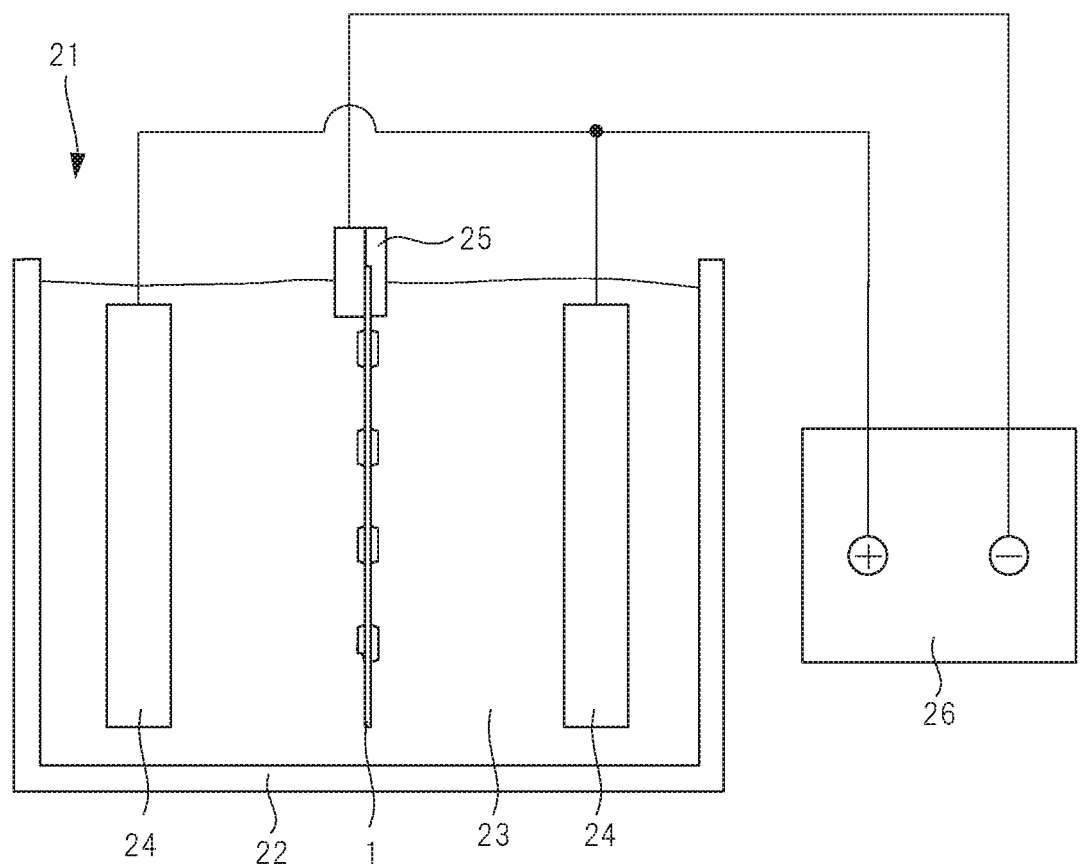
FIG. 20 is a cross-sectional view showing a lead plating step.
Figure 21:
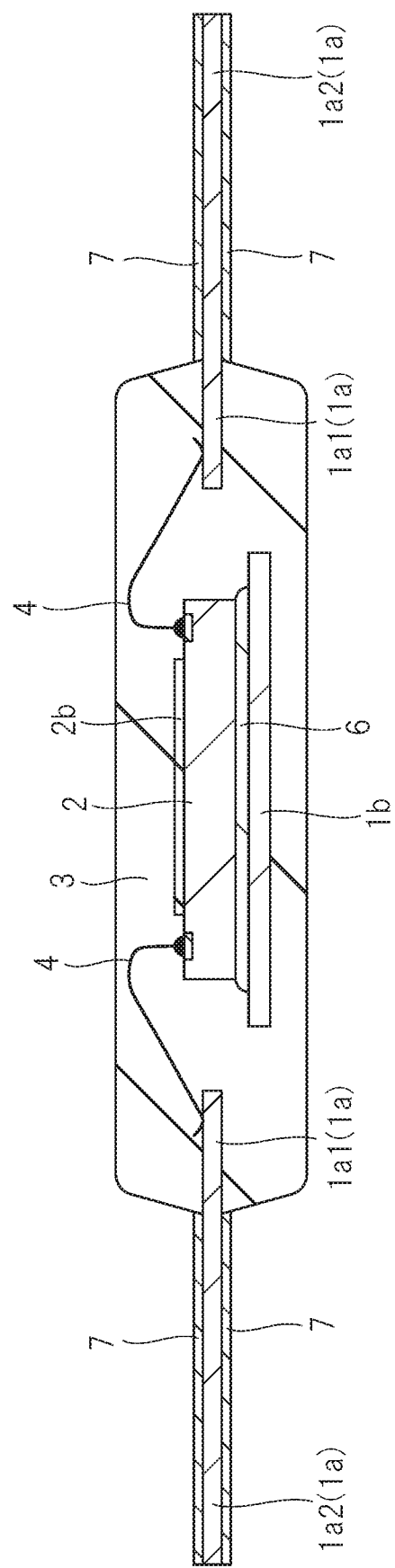
FIG. 21 is an enlarged cross-sectional view of the device region in the lead plating step.
Figure 22:
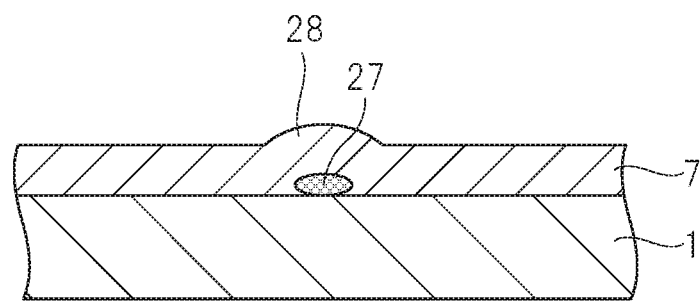
FIG. 22 is a partial cross-sectional view of a lead frame as a comparative example.
Figure 23:
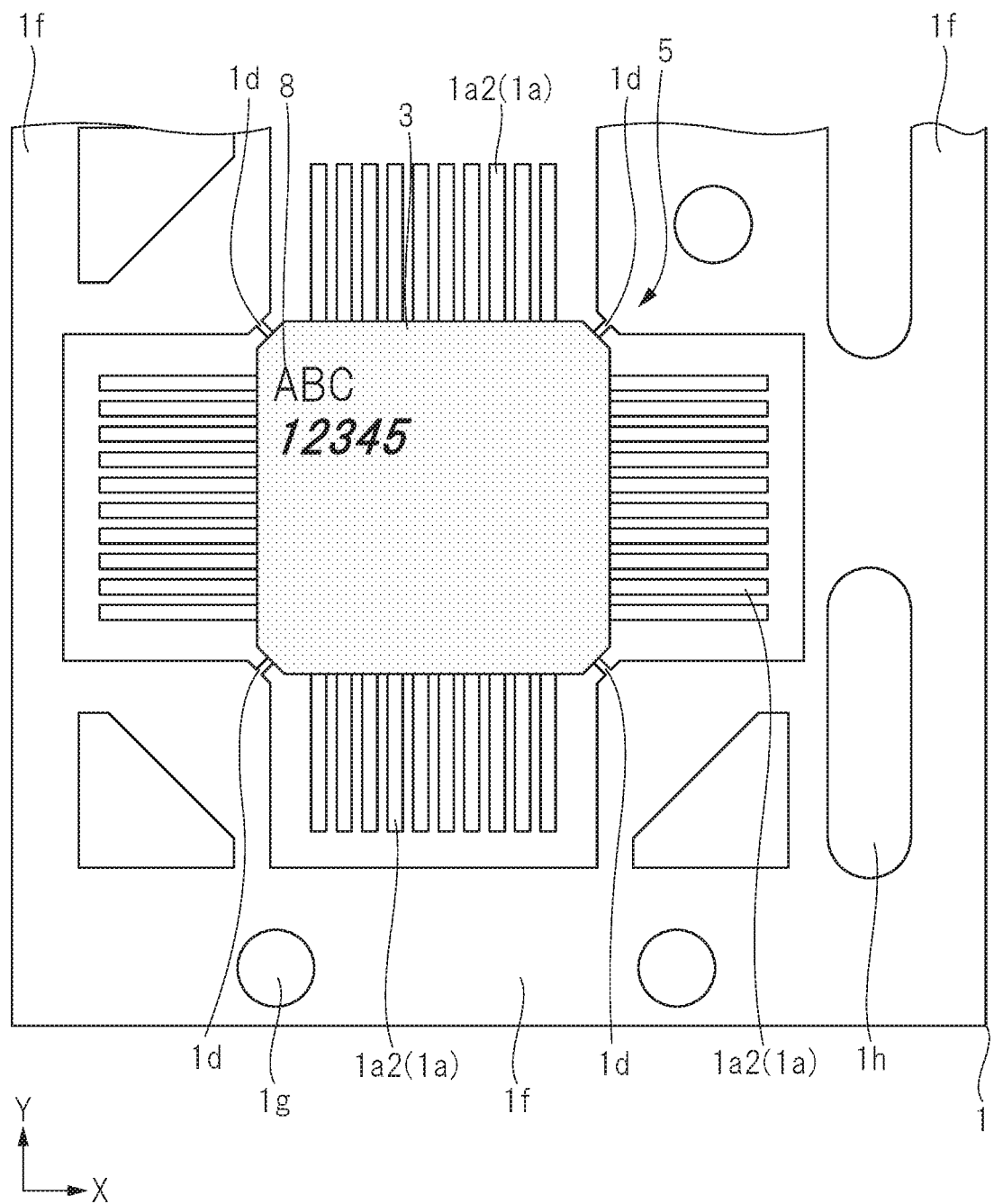
FIG. 23 is an enlarged plan view of the device region in the lead cutting and molding step.

FIG. 3 is a step flow diagram showing a method of manufacturing a semiconductor device according to the embodiment, FIG. 4 is a plan view of a lead frame used in the method of manufacturing a semiconductor device according to the embodiment, FIG. 5 is an enlarged plan view of a device region shown in FIG. 4, FIG. 6 is an enlarged plan view of a device region in a die bonding step, FIG. 7 is a cross-sectional view along line A-A of FIG. 6, FIG. 8 is an enlarged plan view of a device region in a wire bonding step, FIG. 9 is a cross-sectional view along line A-A of FIG. 8, FIG. 10 is an enlarged plan view of a device region in a resin sealing step, FIG. 11 is a cross-sectional view along line A-A of FIG. 10, FIG. 12 is a cross-sectional view along line B-sectional view of FIG. 10, FIG. 13 is a cross-sectional view of a device region in an inspection step, FIG. 14 is a plan view of a lead frame in an inspection step, FIG. 15 is an enlarged cross-sectional view of a device region in a tie bar step, and FIG. 18 is an enlarged plan view of the device region in the laser marking step, FIG. 18 is an enlarged plan view of the device region in the defective product removing step, FIG. 19 is a plan view of the lead frame in the defective product removing step, FIG. 20 is a cross-sectional view showing the lead plating step, FIG. 21 is an enlarged cross-sectional view of the device region in the lead plating step, FIG. 22 is a partial cross-sectional view of the lead frame as a comparative example, and FIG. 23 is an enlarged plan view of the device region in the lead cutting and molding step.

First, in the lead frame preparation step shown in FIG. 3, the lead frame 1 shown in FIG. 4 is prepared.

As shown in FIG. 4, a plurality of device regions 1e are arranged in a matrix in a rectangular lead frame 1.

Here, a total of 48 device regions 1e, 12 in the X direction and 4 in the Y direction, are arranged in a matrix, but the number is not limited to this.

In the X direction and the Y direction, the periphery of each device region 1e is surrounded by a frame portion 1f.

A slit 1h extending in the Y direction is intermittently arranged along the Y direction in a frame portion 1f between device regions adjacent to each other in the X direction.

The slit 1h has a function of preventing the stress applied to the lead frame 1 from reaching the device region 1e.

A plurality of guide holes (positioning holes) 1g are provided in the frame portion 1f extending in the X direction.

The positions of the plurality of device regions 1e can be specified using the guide hole 1g as a reference.

The lead frame 1 is formed of, for example, a copper plate.

Next, the device region 1e will be described with reference to FIG. 5.

One die pad 1b is provided in the device region 1e, and a plurality of leads 1a are provided around the die pad 1b.

The die pad 1b has a substantially rectangular shape, and four corner portions thereof are supported by the suspending leads 1d and connected to the frame portion 1f.

A plurality of leads 1a extending in the Y direction are connected by a dam bar 1c extending in the X direction in the vicinity of the boundary between the inner portion 1a1 and the outer portion 1a2, and the dam bar 1c is connected to the frame portion 1f.

Further, the end portions of the plurality of leads 1a extending in the Y direction on the side of the die pad 1b are separated from each other, and the end portions on the side of the frame portion 1f are connected by the inner frame portion 1fa extending in the X direction.

Similarly, a plurality of leads 1a extending in the X direction are connected by a dam bar 1c extending in the Y direction in the vicinity of the boundary between the inner portion 1a1 and the outer portion 1a2, and the dam bar 1c is connected to the frame portion 1f.

Further, the end portions of the plurality of leads 1a extending in the X direction on the side of the die pad 1b are separated from each other, and the end portions on the side of the frame portion 1f are connected by the inner frame portion 1fa extending in the Y direction.

As shown in FIG. 5, the periphery of the device region 1e is surrounded by the frame portion 1f, but the frame portion 1f also extends to the corner portion of the device region 1e.

The hanging lead 1d and the dam bar 1c are connected to the frame 1f located at the corner of the device region 1e. That is, the device region 1e includes a part of the frame portion 1f.

Next, the die bonding step shown in FIG. 3 will be described.

As shown in FIGS. 6 and 7, a semiconductor chip 2 having a plurality of pad electrodes 2a is mounted on a die pad 1b via an adhesive layer 6.

As shown in FIG. 7, an organic protective film 2b is provided on the surface of the semiconductor chip 2.

In FIG. 6 and subsequent plan views, the adhesive layer 6 and the organic protective film 2b are omitted.

Next, the wire bonding step shown in FIG. 3 will be described.

As shown in FIGS. 8 and 9, the pad electrode 2a of the semiconductor chip 2 is electrically connected to the inner portion 1a1 of the lead 1a by a wire 4.

Next, the resin sealing step shown in FIG. 3 will be described.

As shown in FIGS. 10 to 12, the semiconductor chip 2, the die pad 1b, the wire 4, and the inner portion 1a1 of the lead 1a are disposed in the cavity portion 10c, which is a space provided in the mold 10, and a sealing resin is injected from the gate portion 12 into the cavity portion 10c to form the sealing body 3.

The lead frame 1a is sandwiched between the first mold 10a and the second mold 10b each having a concave portion, whereby the cavity portion 10c is formed in a region corresponding to the concave portion of the first mold 10a and the second mold 10b.

Then, the sealing resin injected into the cavity portion 10c is cured to form the sealing body 3.

As shown in FIG. 10, in plan view, the four sides of the sealing body 3 are located on the inner side of the dam bar 1c (on the side of the semiconductor chip 2).

Therefore, a resin corresponding to the thickness of the lead 1a adheres to a region between the sealing body 3 and the dam bar 1c and between the adjacent leads 1a.

The resin in this region is called "resin burr".

That is, in the non-defective product in the resin sealing step, since the entire region of the cavity 10c is filled with the sealing resin, resin burrs are formed between all the adjacent leads 1a on the four sides of the sealing body 3.

On the other hand, when an unfilled portion of the sealing resin occurs in the cavity 10c, for example, a region where no resin burr is formed exists on the side of the sealing body 3.

In this manner, the semiconductor device 5 in which the unfilled portion of the sealing resin is present in the cavity 10c is referred to as an unfilled defect.

The reason why the unfilled defect of the sealing resin occurs is that the size of the injection port of the sealing resin decreases with the thinning of the semiconductor device 5.

The injection port of the sealing resin is a boundary between the cavity portion 10c and the gate portion 12, and the size thereof is a thickness $Tg=0.25$ mm and a width $Tw=0.35$ mm.

Despite the decrease in the size of the injection port, the viscosity of the sealing resin becomes high, and a large amount of silica filler is contained, so that unfilled defects tend to occur.

Next, the inspection step shown in FIG. 3 will be described.

As shown in FIG. 13 and FIG. 14, all the device regions 1e of the lead frame 1 are subjected to a determination inspection of a non-defective product or a defective product in the resin sealing step.

As shown in FIG. 13, with respect to the lead frame 1 in which the resin sealing step is completed, the illuminating device 13 is disposed on the back surface 3b side of the sealing body 3, and the camera 14 is disposed on the main surface 3a side of the sealing body 3, and the unfilled inspection of the resin in the resin sealing step is performed.

The illumination device 13 includes, for example, a light source in which a plurality of white LEDs are arranged in a matrix, and a light diffusion plate covering the light source.

The camera 14 is, for example, a CCD camera.

In all the device regions 1e, the presence or absence of the resin burr is checked to determine whether the resin sealing step is non-defective or defective.

FIG. 14 shows an example in which four defective areas 16 surrounded by a broken line exist, and the other device areas 1e are the non-defective areas 15.

In the defective region 16, the sealing resin is not filled, and as shown in FIG. 18, the semiconductor chip 2, the die pad 1b, and the like are exposed from the sealing body 3.

Next, the dam bar cutting step shown in FIG. 3 will be described.

As shown in FIG. 15, the dam bar 1c shown in FIG. 10 is cut to separate the outer portions 1a2 of the adjacent leads 1a from each other.

In this step, the resin burrs described above can also be removed.

Next, the laser marking step shown in FIG. 3 will be described.

Figure 16:
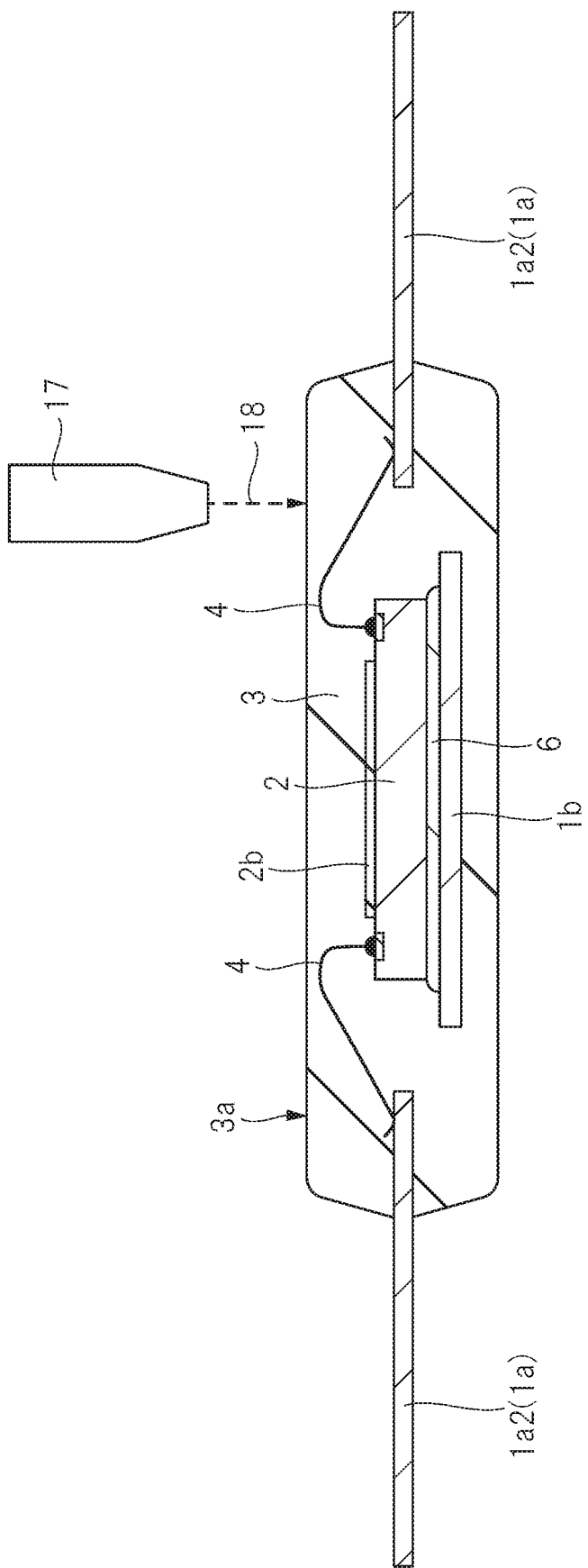
FIG. 16 is an enlarged cross-sectional view of the device region in the laser marking step.
Figure 17:
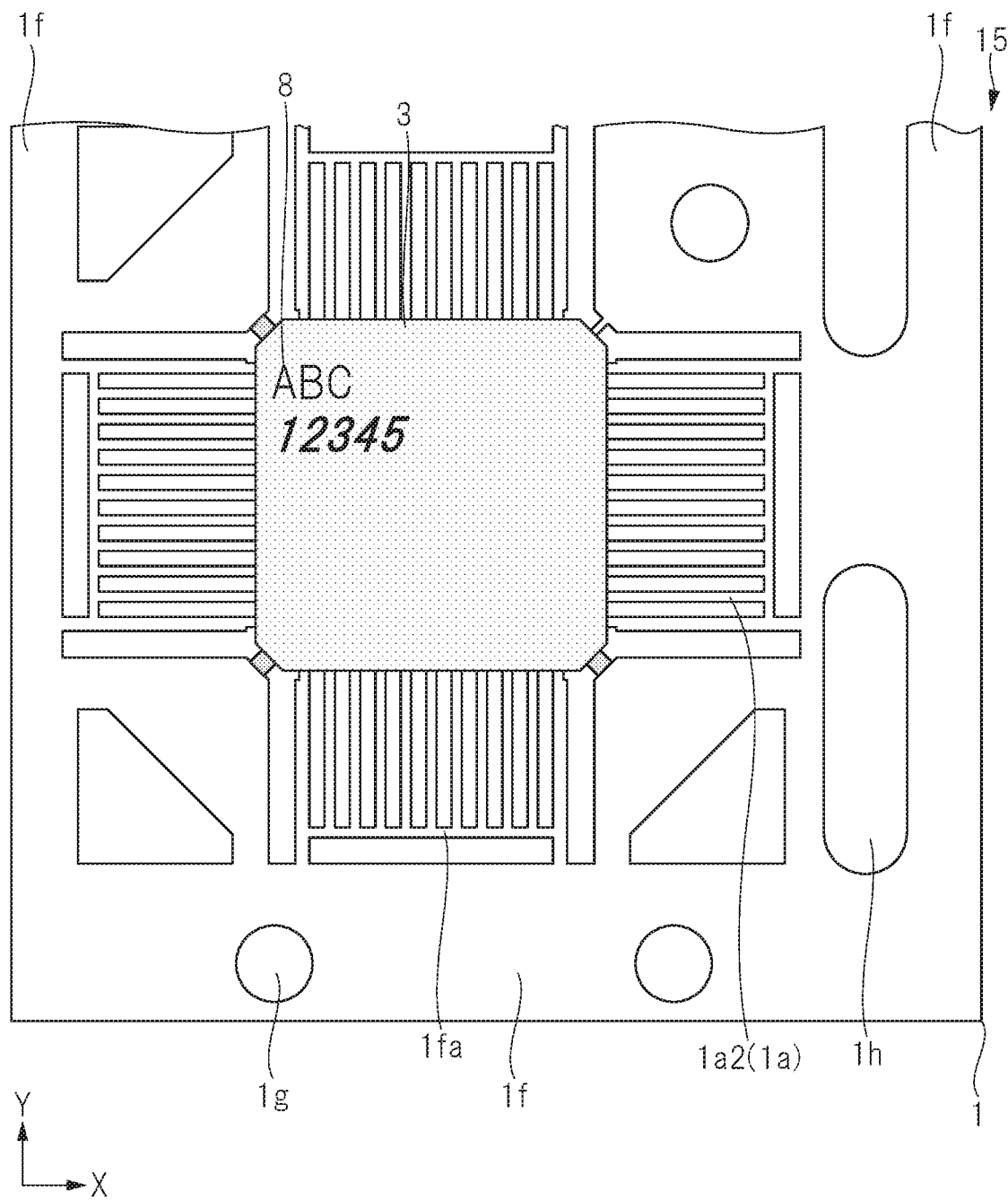
FIG. 17 is an enlarged plan view of the device region in the laser marking step.

As shown in FIGS. 16 and 17, for example, a laser device 17 such as a YAG laser or the like is used to irradiate the main surface 3a of the sealing body 3 with a laser beam 18 to attach a mark 8 to the main surface 3a of the sealing body 3.

The mark 8 is applied only to the sealing body 3 of the semiconductor device 5 in the non-defective region 15 described above.

A defective mark 16a shown in FIG. 18 is attached to the sealing body 3 in the defective region 16.

Here, the output density W1 of the laser beam 18 is about SW/0.001 mm$^2$.

Next, the defective product removing step shown in FIG. 3 will be described.

As shown in FIG. 18, the laser device 17 is used to remove all the semiconductor devices 5 in the defective region 16 existing in the lead frame 1.

First, in the laser marking step, the defective mark 16a attached to the sealing body 3 of the defective region 16 is detected by a camera or the like to specify the defective region 16.

Subsequently, the semiconductor device 5 in the defective region 16 is removed by irradiating a plurality of cut portions 19 shown in FIG. 18 with a laser beam to form grooves in the lead frame 1.

Here, the output density W2 of the laser beam 18 is about 10 W/0.001 mm$^2$ (13 W/0.001 mm$^2$ or less) by using the laser device 17 in the laser marking step.

In order to form a groove in the lead frame 1, it is preferable to make the output density W2 larger than the output density W1 (W2>W1).

However, if the output density W2 is too large, the cutting point 19 of the lead frame 1 becomes hot, and foreign matter may scatter from the cutting point and scatter into the non-defective product region 15.

Therefore, it is preferable to form the groove by performing the scanning a plurality of times while sequentially scanning the plurality of cutting points 19.

As described above, by repeating the scanning, the depth of the groove is made equal to or greater than the thickness of the lead frame 1, whereby the outer portion 1a2 of the lead 1a can be separated from the frame portion 1f of the lead frame 1.

Further, the depth of the groove is made smaller than the thickness of the lead frame 1, and the defective region 16 can be removed from the frame portion 1f by pressing the defective region 16 after the groove is formed.

Further, it is preferable that the cutting portion 19 is a boundary between the outer portion 1a2 of the lead 1a and the frame portion 1f.

In other words, it is preferable to remove the semiconductor chip 2, the die pad 1b, the sealing body 3, the wire 4, and the inner portion 1a1 and the outer portion 1a2 of the lead 1a in the defective region 16.

Thus, as shown in FIG. 19, an opening 20 is formed in the defective region 16 of the lead frame 1.

Of course, openings are formed for all defective areas 16.

As described above, since the laser marking step and the defective product removing step are performed by using one laser device 17, it is possible to realize a reduction in manufacturing cost and a reduction in manufacturing time.

Since the laser marking step and the defective product removing step are successively performed on one lead frame 1, only one alignment step of the lead frame 1 with respect to the laser device 17 is required, so that the manufacturing time can be shortened.

The order of the laser marking step and the defective product removing step may be reversed.

Further, since it is necessary to change the output density of the laser beam in the laser marking step and the defective product removing step, for example, it is preferable to perform the defective product removing step on the defective product after performing the laser marking step on all the defective products of the lead frame 1.

The order of the laser marking step and the defective product removing step may be reversed.

Next, the lead plating step shown in FIG. 3 will be described.

As shown in FIGS. 20 and 21, a plating layer 7 is formed on the outer portion 1a2 of the lead 1a by electrolytic plating on the lead frame 1 from which the defective region 16 has been removed.

In the plating apparatus 21, a plating solution 23 is filled in a plating tank 22, and a lead frame 1 serving as an anode 24 and a cathode is disposed in the plating solution 23.

Metallic salts such as Sn2+ and Bi3+ are contained in the plating solution 21, and the plating layer 7 made of SnBi lead-free solder is formed on the outer portion 1a2.

Here, a comparative example will be described with reference to FIG. 22.

In the embodiment, the plating layer 7 is formed on the lead frame 1 after removing the defective region 16 as described with reference to FIGS. 18 and 19, but in the comparative example, it is assumed that the plating layer 7 is formed on the lead frame 1 while leaving the defective region 16.

As shown in FIG. 18, in the defective region 16, the semiconductor chip 2 and the die pad 1b are exposed from the sealing body 3.

In other words, the adhesive layer 6 existing between the semiconductor chip 2 and the die pad 1b or the organic protective film 2b formed on the semiconductor chip 2 is also exposed from the sealing body 3.

When the lead frame 1 leaving the defective region 16 is immersed in the plating solution 23, metal foreign matter or insulating foreign matter is mixed into the plating solution 23 from the adhesive layer 6 or the organic protective film 2b, and the plating solution 23 is contaminated.

When the lead plating step is performed on the subsequent lead frame 1, there is a risk that a plating defect occurs.

For example, as shown in FIG. 22, if a foreign substance 27 such as a metal adheres to the surface of the lead frame 1, abnormal growth 28 of plating occurs at that portion, and there is a risk that, for example, a defect occurs in which a short circuit occurs between adjacent leads 1a.

When an insulator adheres to the surface of the lead frame 1, the plated layer 7 is not formed on the surface of the lead frame 1.

In the embodiment, since such contamination of the plating solution 23 can be prevented, plating defects can be reduced, and reliability and yield of the semiconductor device can be improved.

Next, the lead cutting and molding step shown in FIG. 3 will be described.

As shown in FIG. 23, the inner frame portion 1fa connecting the end portions of the outer portion 1a2 of the lead 1a is removed, and the adjacent outer portions 1a2 are separated from each other.

Next, the outer portion 1a2 is formed into a gull wing shape as shown in FIG. 2.

The tie bar cutting step shown in FIG. 3 can also be performed in the lead cutting step in the lead cutting and molding step.

That is, the tie bar cutting step can be performed using a jig used in the lead cutting step, and the lead cutting step can be performed using a similar jig.

Next, the separation step shown in FIG. 3 will be described.

The semiconductor device 5 is separated from the frame portion 1f by cutting the suspension lead 1d shown in FIG. 23.

Next, the reliability test step shown in FIG. 3 will be described.

Electrical tests and the like are performed on the semiconductor devices 5 that have been separated individually to detect defects other than the resin sealing step, and defective products are removed.

In this way, the non-defective semiconductor device 5 is finally completed.

Figure 24:
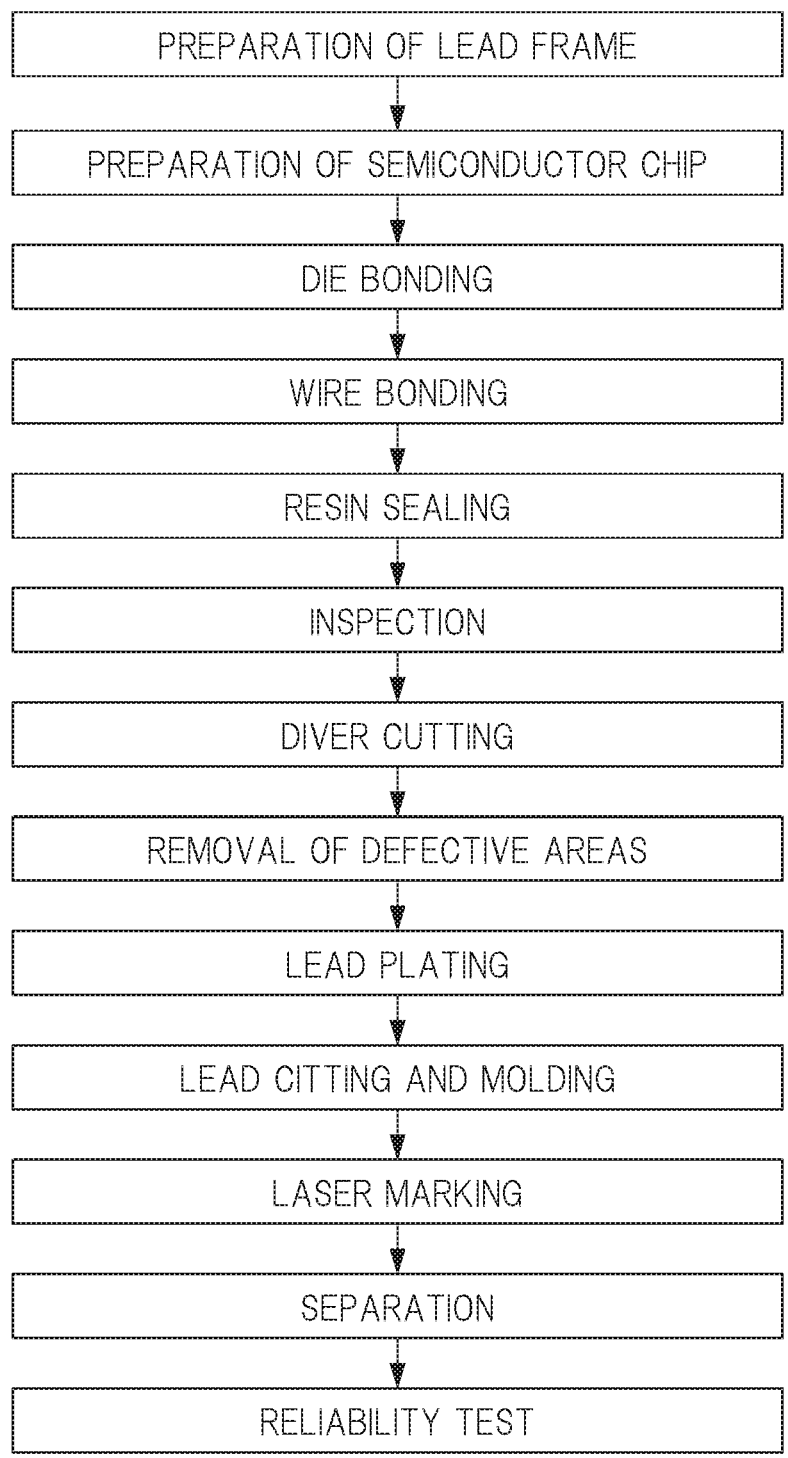
FIG. 24 is a step flow diagram showing a method of manufacturing a semiconductor device according to a modification.

FIG. 24 is a step flow diagram showing a method of manufacturing a semiconductor device according to a modification.

As shown in FIG. 24, the laser marking step may be performed between the lead cutting and molding step and the separation step.

The invention made by the present inventor has been described above in detail based on the embodiment, but the present invention is not limited to the embodiment described above, and it is needless to say that various modifications can be made without departing from the gist thereof.

For example, although the above embodiment mode has been described using a QFP semiconductor device, the present invention can be applied to a QFJ (Quad Flat J-leaded Package), SOP (Small Outline Package), SOJ (Small Outline J-leaded Package), or QFN (Quad Flat Non Lead) semiconductor device.

What is claimed is:

1. A method of manufacturing semiconductor device, the method comprising the steps of:
   (a) preparing a lead frame on which a plurality of device regions is arranged in a matrix and respectively have a die pad and a plurality of leads which respectively have an inner portion and an outer portion;
   (b) mounting a semiconductor chip on the die pad of each of the plurality of device regions via an adhesive layer;
   (c) forming a resin sealing body sealing the semiconductor chip, the inner portion of each of the plurality of leads, the adhesive layer and the die pad on each of the plurality of device regions of the lead frame;
   (d) forming a plating layer on the outer portion of each of the plurality of leads exposed from the resin sealing body;
   (e) between the step (c) and the step (d), detecting a defect on each of the plurality of device regions of the lead frame by identifying a portion in which the resin of the step (c) is not filled as a defective region; and
   (f) between the step (e) and the step (d), rejecting the defective device region having the defect from the lead frame.

2. The method according to claim 1, wherein, between the step (e) and the step (d), a first laser beam is irradiated to the resin sealing body for forming a mark on the resin sealing body with a laser equipment.

3. The method according to claim 2, wherein, in the step (f), a second laser beam is irradiated at the lead frame for forming a plurality of grooves on a plurality of cutting positions of the lead frame with the laser equipment.

4. The method according to claim 3, wherein an output density of the second laser beam is greater than an output density of the first laser beam.

5. The method according to claim 3, wherein, in the step (f), the second laser beam scans the plurality of cutting positions in order and the plurality of grooves are formed on the plurality of cutting positions by several laser scanning.

6. The method according to claim 3, wherein, in the step (f), each of depth of the plurality of grooves pierces through the lead frame in a thickness direction of the lead frame.

7. The method according to claim 3, wherein each of depth of the plurality of grooves is shallower than a thickness of the lead frame in the thickness direction.

8. The method according to claim 1, wherein, in the step (f), the defective device region includes the resin sealing body and the outer portion of each of the plurality of leads.

\* \* \* \* \*